(12) United States Patent
Park

(10) Patent No.: US 7,154,316 B2
(45) Date of Patent: Dec. 26, 2006

(54) CIRCUIT FOR CONTROLLING PULSE WIDTH

(75) Inventor: Mun Phil Park, Namyangju-Shi (KR)

(73) Assignee: Hynix Semiconductor Inc., Kyungki-do (KR)

( * ) Notice: Subject to any disclaimer, the term of this patent is extended or adjusted under 35 U.S.C. 154(b) by 1 day.

(21) Appl. No.: 10/878,770

(22) Filed: Jun. 28, 2004

(65) Prior Publication Data
US 2005/0122147 A1   Jun. 9, 2005

(30) Foreign Application Priority Data
Dec. 5, 2003   (KR)   ................... 10-2003-0088282

(51) Int. Cl.
*H03K 3/017* (2006.01)
(52) U.S. Cl. .................... 327/172; 327/166
(58) Field of Classification Search ........ 327/172–176, 327/161, 162, 165, 166, 291
See application file for complete search history.

(56) References Cited

U.S. PATENT DOCUMENTS

| 5,646,565 | A | * | 7/1997 | Tukidate ................. 327/174 |
| 5,808,961 | A | * | 9/1998 | Sawada .................. 365/233 |
| 6,094,080 | A | * | 7/2000 | Jeong et al. ............. 327/176 |
| 6,151,270 | A | * | 11/2000 | Jeong .................... 365/233 |
| 6,504,789 | B1 | * | 1/2003 | Hirakawa ............... 365/233 |
| 6,621,315 | B1 | * | 9/2003 | Heo et al. ............... 327/158 |
| 6,784,709 | B1 | * | 8/2004 | Ryu ...................... 327/172 |
| 7,030,671 | B1 | * | 4/2006 | Park ...................... 327/172 |

FOREIGN PATENT DOCUMENTS

| KR | 1998-030999 | 7/1999 |
| KR | 2001-0036041 | 5/2001 |

* cited by examiner

*Primary Examiner*—Timothy P. Callahan
*Assistant Examiner*—Hai L. Nguyen
(74) *Attorney, Agent, or Firm*—Marshall, Gerstein & Borun LLP

(57) ABSTRACT

Provided is directed to a circuit for controlling a pulse width which can be adjustable to a next generation standard DRAM such as a high speed DDR2 or DDR3 as well as a high speed graphic DRAM for supplying various CAS latencies by means of including: a mode register set for setting a plurality of CAS latencies according to an operation frequency by a command inputted from a chip set; and a pulse generation circuit for generating a pulse having a variable width by using a delay time according to the plurality of CAS latencies set in the mode register set.

13 Claims, 4 Drawing Sheets

CIRCUIT FOR CONTROLLING PULSE WIDTH

This application relies for priority upon Korean Patent Application No. 2003-0088282 filed on Dec. 5, 2003, the contents of which are herein incorporated by reference in their entirety.

BACKGROUND

1. Field of the Invention

The present invention relates to a circuit for controlling a pulse width, and more particularly to, a circuit for controlling a pulse width of a column address select signal.

2. Discussion of Related Art

Recently, a high speed DRAM or DDR has been used in a graphic field. A pulse width, especially a pulse width of a column address select signal remarkably influences an operation of the device.

It is thus very important to control an appropriate pulse width of the column address select signal according to various conditions such as a low frequency to a high frequency. In general, the pulse width of the column address select signal is preset as a predetermined value or controlled by an external clock.

A method for setting a pulse width of a column address select signal as a predetermined value generates a predetermined width of pulse regardless of tCK, namely a frequency. However, a standard for controlling the pulse width is ambiguous. When the pulse width is set at a low frequency, tCCD or tWTR is generated in a high frequency operation, to cause operation failure. Conversely, when the pulse width is set at a high frequency, the pulse width is too narrow to deteriorate tWR. Accordingly, data are not sufficiently written on a DRAM cell.

A method for controlling a column address select signal according to an external clock is not sensitive to variations of a process, voltage and temperature, and thus is relatively stable at a high frequency. However, the column address select signal has a narrow pulse width corresponding to half of a pulse width of the external clock. Differently from a DDR1, a DDR2 SDRAM maintains 2tCK of tCCD, and thus the column address select signal has a pulse width larger than half of the pulse width of the external clock (maximally, two times). Therefore, the DDR2 SDRAM cannot increase an operational margin. In addition, when the column address select signal is controlled according to the external clock, the pulse width of the column address select signal is large enough at a low frequency to cause problems in a normal operation or a test.

SUMMARY OF THE INVENTION

The present invention is directed to a pulse width control circuit for controlling a pulse width by using a delay time according to a CAS latency set in a mode register set MRS One aspect of the present invention is to provide a circuit for controlling a pulse width which can solve the above problems by generating a pulse width varied in response to an operation frequency.

Here, a DRAM for a desktop or a DRAM for a graphic field which has been used requires a high speed operation and supplies many number of CAS latencies (hereinafter, referred to as CL) as an external clock gets fast. In case of a high frequency DRAM, the CL has been supplied for 2~9, and may be supplied more than that henceforth. Here, as an operation is performed in a high speed, the CL is larger.

In the present invention, an operation frequency of DRAM is analogized by using the CL set in the mode register set MRS, and the CL is inputted in a pulse delay unit of a column address select signal generation circuit. During this, the CL has a fixed value which isn't varied until the next MRS is set for the level signal. The CLs inputted in the pulse delay unit have their own delay time for each, and the pulse width control unit can control a pulse with an appropriate width by using a delay pulse outputted according to the delay time. As a result, the column address select signal can have an optimized pulse width for the CLs. Accordingly, it can improve stabilization of an asynchronous signal in the DRAM.

A pulse width control circuit in accordance with the present invention includes: a means for setting a plurality of CAS latencies according to an operation frequency by a command inputted from a chip set; and a pulse generation circuit for generating a pulse with a variable width by using a delay time according to the plurality of CAS latencies.

The pulse generation circuit includes: a pulse generation unit for generating a pulse according to a plurality of control signals; a latch for latching the pulse generated from the pulse generator; a pulse width control unit for controlling a pulse width by delaying a signal outputted from the latch by using a delay time according to the plurality of CAS latencies; and a logic unit for combining the output signal of the latch and an output signal of the pulse delay unit.

The pulse generation circuit further includes a plurality of delay means for delaying the pulse generated from the signal generation unit.

The pulse generation unit includes: a NAND gate for receiving a first control signal and a second control signal; and a NOR gate for generating a pulse by receiving an output signal from the NAND gate and third and fourth control signals.

The pulse width control unit includes: a plurality of delay means for delaying the pulse outputted from the latch; and a plurality of switching means connected respectively to output terminals of the plurality of delay means and driven by each CAS latency inputted from the mode register set, for setting a delay path.

The switching means are comprised of: an inverter for inverting the plurality of CAS latencies, respectively; and a plurality of transmission gates driven by the plurality of CAS latencies and output signals of the plurality of inverters.

The logic means is a NAND gate.

In addition, the pulse width control circuit in accordance with the present invention includes: a means for setting the plurality of CAS latencies according to a command inputted from a chip set; a pulse generation unit for generating a pulse by a plurality of control signals; a latch for latching the pulse generated from the pulse generation unit; a pulse width control unit for controlling the pulse with a variable width according to an operation frequency by delaying the signal outputted from the latch, by using the delay time according to the plurality of CAS latencies; and a logic means for combining a signal outputted from the latch and an output signal of the pulse width control unit.

BRIEF DESCRIPTION OF THE DRAWINGS

A more complete understanding of the present invention may be had by reference to the following description when taken in conjunction with the accompanying drawings in which.

DETAILED DESCRIPTION OF PREFERRED EMBODIMENTS

Hereinafter, it will be described about the present invention with reference to the accompanying drawings in detail.

Figure 1:
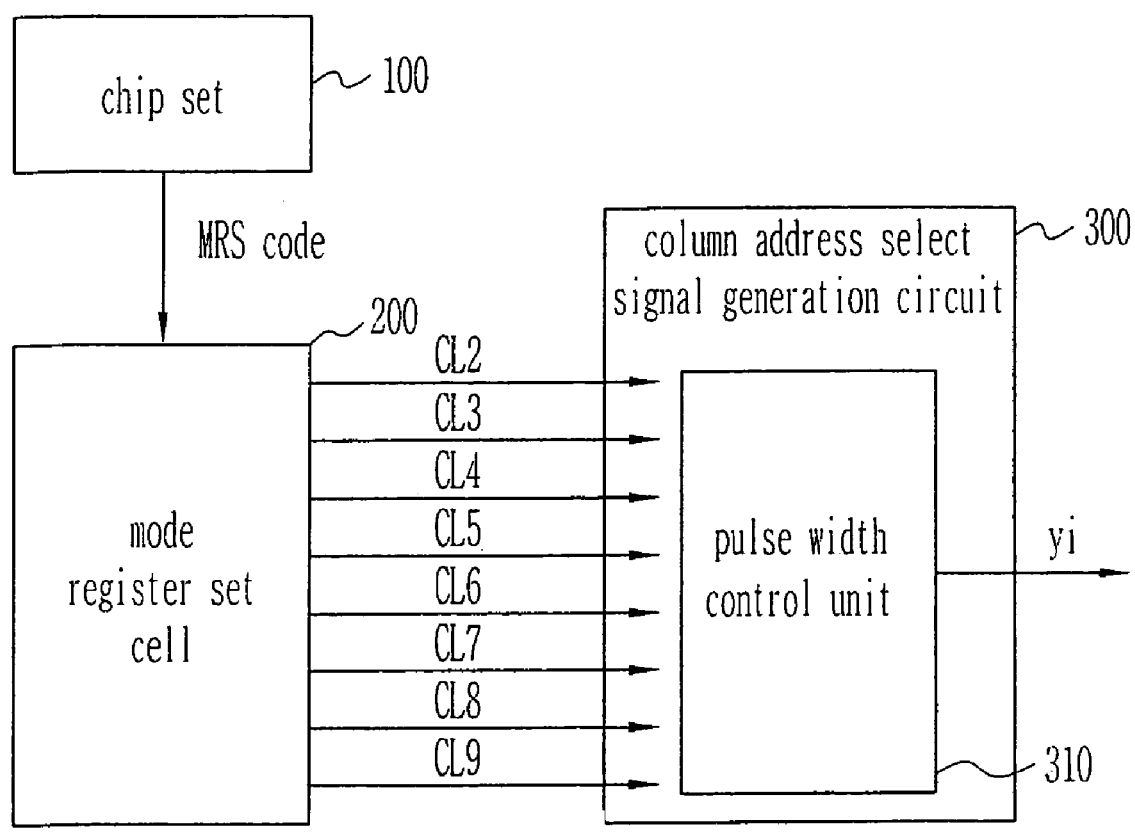
FIG. 1 is a schematic diagram of a pulse width control circuit in accordance with an embodiment of the present invention.

FIG. 1 is a block diagram for controlling a pulse width of a column address select signal according to an embodiment of the present invention, which will be described as follows.

When a corresponding MRS code is inputted in an external chip set 100, a CL corresponding to the code is set in a mode register set 200. For instance, the CL is approximately 2~9 in a high frequency DRAM for a graphic so that it is assumed the CL as 2~9 in the present invention. The set CL is inputted to a pulse width control unit 310 of a column address signal generation circuit 300 for generating a column address select signal. The CLs inputted in the pulse width control unit 310 have their own delay time, respectively and then a delay pulse outputted thereof is generated as the column address select signal having an optimized pulse width in the pulse width control unit 310.

Figure 2A:
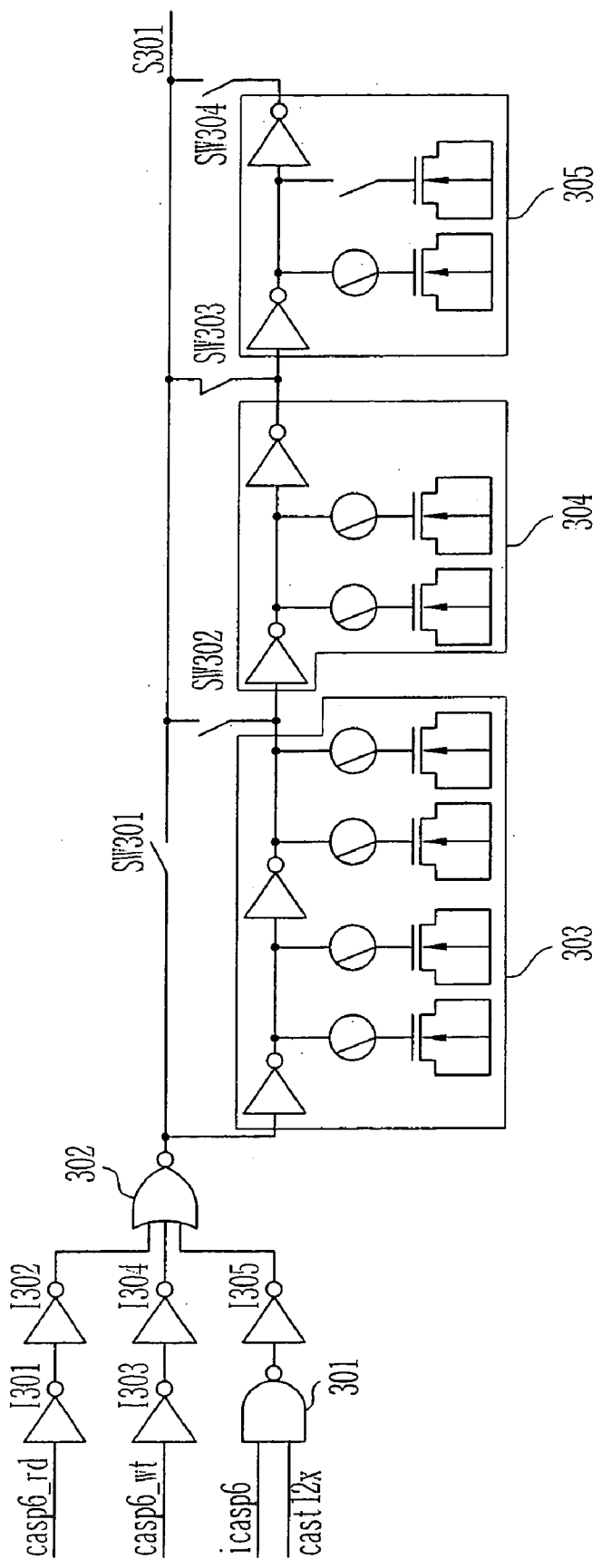
FIGS. 2A and 2B are circuit diagrams illustrating a column address select signal generation circuit in accordance with embodiments of the present invention.
Figure 2B:
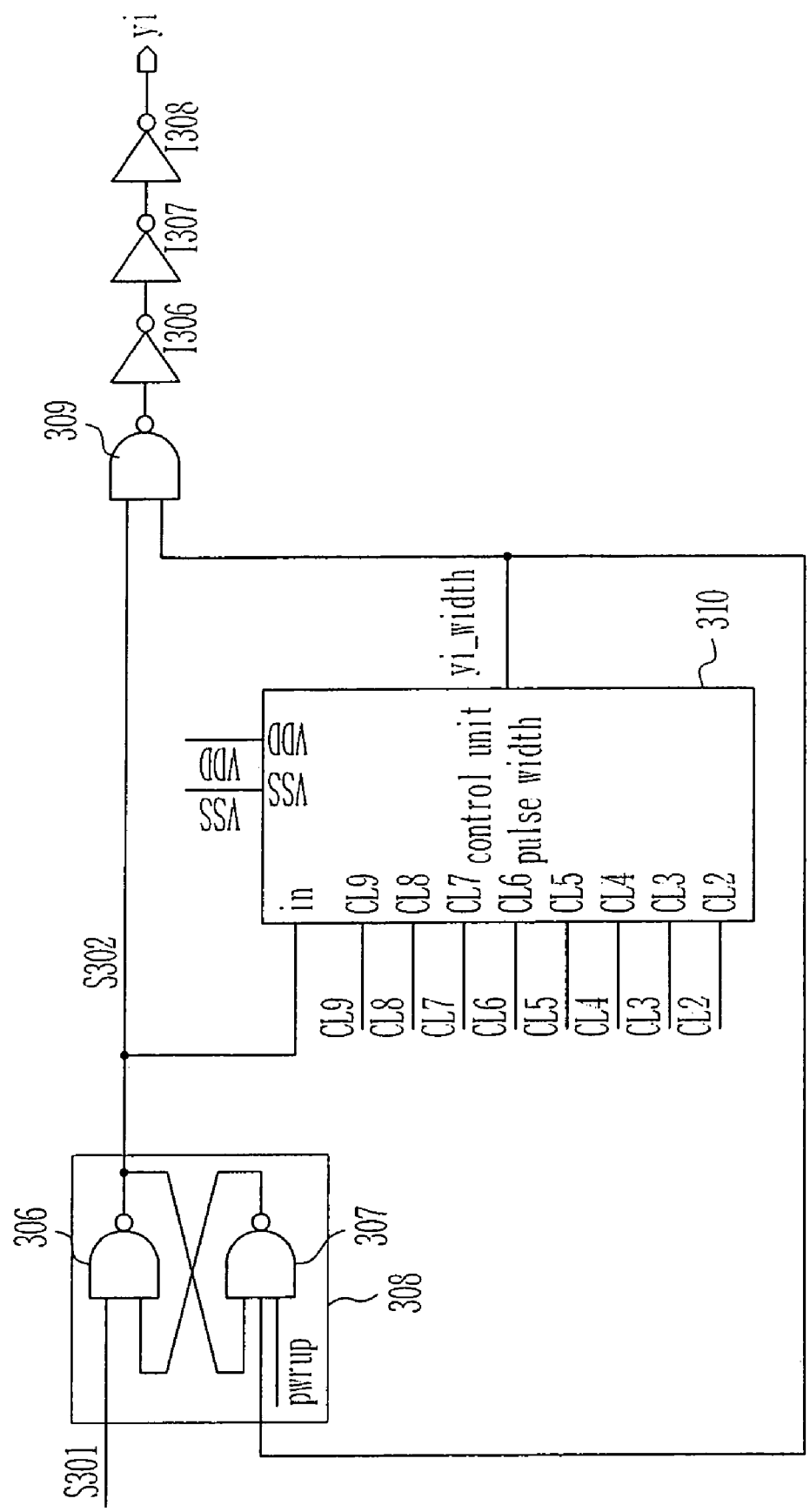

FIGS. 2A and 2B are circuit diagrams of a column address select signal generation circuit in accordance with the present invention, which will be described as follows.

A first inverter I301 inverts a read column pulse casp6_rd, and a second inverter I302 inverts an output of the first inverter I301. Moreover, a third inverter I303 inverts a write column pulse casp6_wt, and a fourth inverter I304 inverts an output of the third inverter I303. Furthermore, a first NAND gate 301 inputs an internal column access pulse icasp6 and a column activation pulse cast12x and then logically combines the two signals, and a fifth inverter I305 inverts an output of the first NAND gate 301. A first NOR gate 302 inputs outputs of the second, fourth, and fifth inverters I302, I304, I305 and then logically combines them. A delay time for an output signal S301 of the first NOR gate 302 is decided by a plurality of delay means 303, 304, 305 alternatively operated by a plurality of switches SW301 to SW304. A first latch 308 comprised of a second NAND gate 306 and a third NAND gate 307 latches the output signal S301 of the first NOR gate 302 and an output signal yi_width of the pulse width control unit 310. Here, the second NAND gate 306 inputs the output signal S301 of the first NAND gate 302 and an output signal S303 of the third NAND gate 307, and the third NAND gate 307 inputs an output signal S302 of the second NAND gate 306, the output signal yi_width of the pulse width control unit 310, and a power-up signal pwrup. The pulse width control unit 310 inputs the plurality of CLs applied from the mode register set 200 and controls a pulse width of the output signal S302 of the second NAND gate 306 according to the delay time by the CLs. As a result, the output signal yi_width is outputted. The fourth NAND gate 309 inputs the output signal S302 of the first latch 308 and the output signal yi_width of the pulse width control unit 310 and then logically combines them. Sixth to eighth inverters 1306 to 1308 invert and delay an output signal of the fourth NAND gate 308, to output a column address select signal yi.

It will be explained of a method for driving the column address signal generation circuit according to the present invention constructed as described above.

When the read column pulse casp16_rd or the write column pulse casp6_wt is applied to a high state, or the internal column access pulse icasp6 and the column activation pulse cast12x are applied to a high state at the same time, the first NOR gate 302 logically combines them, to output a low state pulse S301. The output pulse S301 of the first NOR gate 302 maintaining a low state is inputted into the second NAND gate 306 of the first latch 308, and the second NAND gate 306 outputs a high state output signal S302. The output signal S302 of the second NAND gate 306 maintaining a high state is inputted into the third NAND gate 307 and the pulse width control unit 310. When the output signal S302 of the first latch 308 is inputted, the pulse width control unit 310 sets a corresponding path according to the CL inputted from the mode register set. Accordingly, the output signal yi_width of which the pulse width is controlled by passing through an appropriate delay time according to the CL, is outputted. In addition, the fourth NAND gate 309 receives the output signal S302 of the first latch 308 and the output signal yi_width of the pulse width control unit 310 and logically combines them to output a low state pulse. The output pulse of the fourth NAND gate 309 maintaining a low state outputs a high state column address select signal yi through the sixth to eighth inverters I306 to I308. On the other hand, the output signal of the pulse width control unit 310 is inputted into the third NAND gate 307 with the output signal S302 of the second NAND gate 306 and the power-up signal pwrup and then is logically combined. The output signal S303 of the third NAND gate 307 is inputted into the second NAND gate 306.

Figure 3:
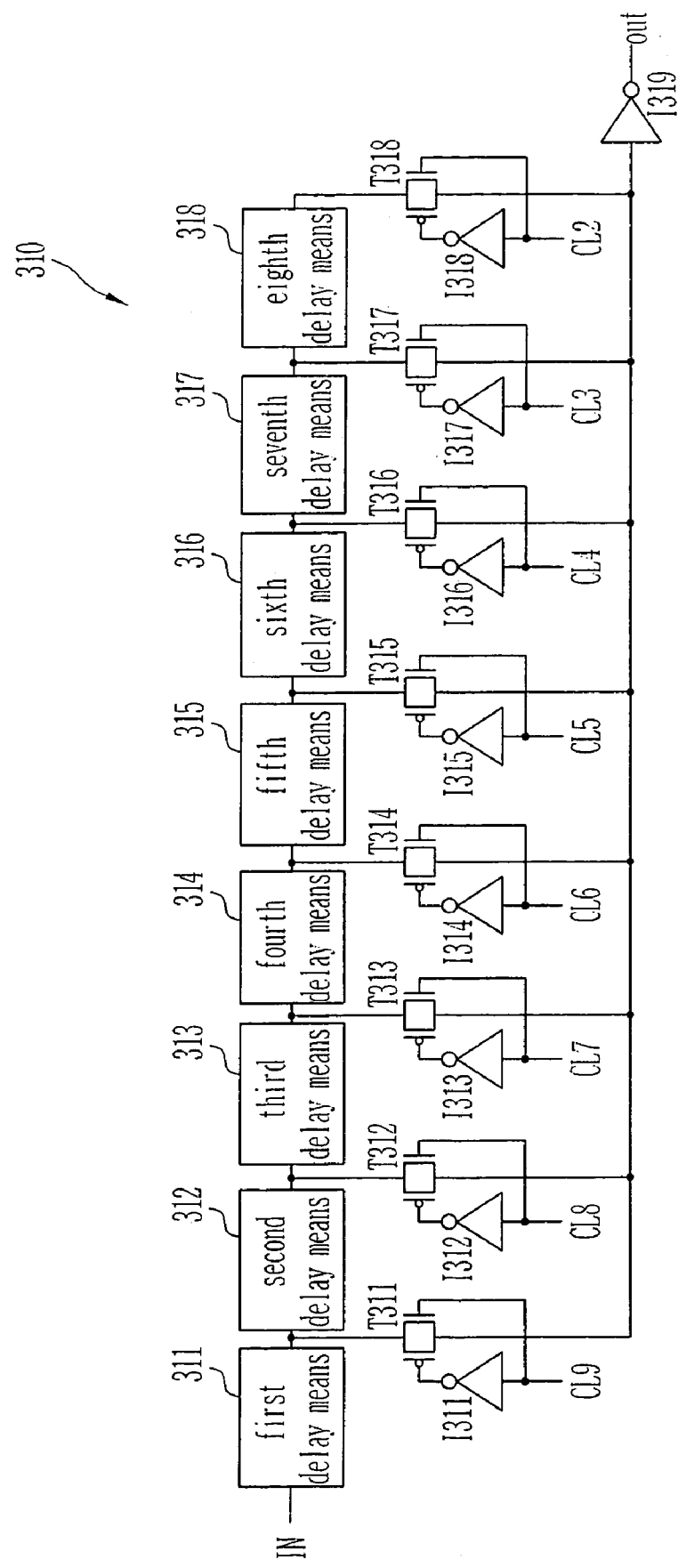
FIG. 3 is a circuit diagram of a pulse width control unit of FIG. 2.

FIG. 3 is a circuit diagram of the pulse width control unit of FIG. 2.

The pulse width control unit according to the present invention is comprised of: a plurality of delay means 311 to 318 connected in series for delaying an input signal IN; a plurality of transmission gates T311 to T318 as a plurality of switching means for setting a delay path by being driven according to each CL which is inverted by each CL and inverters I311 to I318; and an inverter I319 for inverting a signal delayed through each delay means 211 to 214.

The pulse width control unit constructed as described above controls a delay time of an output signal out by deciding a delay path according to the CL. For instance, when the CL set in the mode register set is 6, only CL6 is applied to a high state, and the other CLs are all applied to a low state. The fourth transmission gate T314 is turned on by the CL6 applied to a high state and a signal inverted to a low state by the fourth inverter I314. Accordingly, the input signal IN is delayed through the first to fourth delay means 311 to 314, and the delayed signal is inverted through the inverter I319, to be outputted as the output signal out. As the CL is decreased, the delay time is longer, which results in an increase of the pulse width.

As aforementioned, it is possible to generate the pulse with a variable width according to the operation frequency by analogizing the operation frequency of the DRAM by means of using the CL set in a mode register set, and controlling the pulse width by means of a delay time according to the CL. Therefore, the circuit for controlling the pulse width can be applied to a next generation standard DRAM such as a high speed DDR2 or DDR3 as well as a high speed graphic DRAM for supporting various CLs.

Although the present invention has been described in connection with the embodiment of the present invention illustrated in the accompanying drawings, it is not limited thereto. It will be apparent to those skilled in the art that various substitutions, modifications and changes may be made thereto without departing from the scope and spirit of the invention.

What is claimed is:

1. A circuit for controlling a pulse width, comprising:
   a means for setting a plurality of CAS latencies according to an operation frequency by a command inputted from a chip set; and
   a pulse generation circuit for generating a first pulse signal having a pulse width controlled according to the plurality of CAS latencies, the pulse generation circuit including a plurality of delay means having different delay times so as to determine a delay time of the first pulse signal, thereby controlling the pulse width and the delay time of the first pulse signal.

2. The circuit of claim 1, wherein the pulse generation circuit includes:
   a pulse generation unit for generating a second pulse signal according to a plurality of control signals;
   a latch for latching the second pulse signal generated from the pulse generation unit;
   a pulse width control unit for controlling a pulse width of an output signal from the latch by delaying the output signal from the latch according to the plurality of CAS latencies; and
   a logic unit for outputting the first pulse signal by combining the output signal from the latch and an output signal from the pulse width control unit.

3. The circuit of claim 2, wherein the pulse generation circuit further includes the plurality of delay means for determining the delay time of the second pulse signal generated from the pulse generation unit of the pulse generation circuit.

4. The circuit of claim 2, wherein the pulse generation unit includes:
   a NAND gate for inputting a first control signal and a second control signal; and
   a NOR gate for generating the second pulse signal by inputting an output signal of the NAND gate and third and fourth control signals.

5. The circuit of claim 2, wherein the pulse width control unit includes:
   a plurality of delay means for delaying the output signal from the latch; and
   a plurality of switching means connected between an output terminal of the pulse width control unit and an output terminal of the respective delay means, and respectively operated according to the CAS latencies.

6. The circuit of claim 5, wherein the switching means includes:
   a plurality of inverters for inverting the plurality CAS latencies, respectively; and
   a plurality of transmission gates connected between an output terminal of the pulse width control unit and an output terminal of the respective delay means, and driven by the plurality of CAS latencies and output signals of the plurality of inverters, respectively.

7. The circuit of claim 2, wherein the logic means is a NAND gate.

8. A circuit for controlling a pulse width, comprising:
   a means for setting the plurality of CAS latencies according to a command inputted from a chip set;
   a pulse generation unit for generating a pulse according to a plurality of control signals; a latch for latching the pulse generated from the pulse generation unit;
   a pulse width control unit for controlling a pulse with a variable width according to an operation frequency by delaying a signal outputted from the latch by means of using a delay time according to the plurality of CAS latencies; and
   a logic unit for combining the output signal of the latch and an output signal of the pulse width control unit.

9. The circuit of claim 8, wherein the pulse generation circuit further includes a plurality of delay means for delaying the second pulse signal generated from the signal generation unit of the pulse generation circuit.

10. The circuit of claim 8, wherein the signal generation unit includes:
    a NAND gate for inputting a first control signal and a second control signal; and
    a NOR gate for generating the second pulse signal by inputting an output signal of the NAND gate and third and fourth control signals.

11. The circuit of claim 8, wherein the pulse width control unit includes:
    a plurality of delay means for delaying the output signal from the latch; and
    a plurality of switching means connected between an output terminal of the pulse width control unit and an output terminal of the respective delay means, and respectively operated according to the CAS latencies.

12. The circuit of claim 11, wherein the switching means includes:
    a plurality of inverters for inverting the plurality CAS latencies, respectively; and
    a plurality of transmission gates connected between an output terminal of the pulse width control unit and an output terminal of the respective delay means, and driven by the plurality of CAS latencies and output signals of the plurality of inverters, respectively.

13. The circuit of claim 8, wherein the logic means is a NAND gate.

* * * * *